(12) United States Patent
Kim

(10) Patent No.: US 7,702,987 B2
(45) Date of Patent: Apr. 20, 2010

(54) APPARATUS AND METHOD FOR PROCESSING DATA OF AN OPTICAL DISK

(75) Inventor: Young-goan Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 880 days.

(21) Appl. No.: 11/518,234

(22) Filed: Sep. 11, 2006

(65) Prior Publication Data

US 2007/0079214 A1    Apr. 5, 2007

(30) Foreign Application Priority Data

Sep. 16, 2005    (KR)    ...................... 10-2005-0087017

(51) Int. Cl.
*G11C 29/00*    (2006.01)
(52) U.S. Cl. ...................................... 714/769
(58) Field of Classification Search .................. 714/752, 714/755, 763, 769; 369/52.23, 59.25
See application file for complete search history.

(56) References Cited

U.S. PATENT DOCUMENTS 6,983,413 B2    1/2006    Otake et al.
7,281,193 B2 *  10/2007   Wu et al. ..................... 714/758
7,434,140 B2 *  10/2008   Lin et al. ..................... 714/758
2007/0266299 A1 * 11/2007  Hsueh ........................ 714/769

FOREIGN PATENT DOCUMENTS

JP    2002-185335       6/2002
KR    100223821  B1     7/1999
KR    100257196  B1     2/2000

* cited by examiner

*Primary Examiner*—Shelly A Chase
(74) *Attorney, Agent, or Firm*—Lee & Morse, P.C.

(57) ABSTRACT

A method for decoding data stored in a disk is achieved by demodulating a physical cluster read out from the disk and outputting LDC (long distance code) data and BIS (burst indicator subcode) data included in the physical cluster, temporarily storing part of the LDC data and BIS data of the data included in the physical cluster in a first memory portion, reading out the LDC data and BIS data stored in the first memory portion and storing the read out data in a second memory portion, reading out LDC data and BIS data requiring error correction from the second memory portion and temporarily storing the read out data in the first memory portion, and storing LDC data and BIS data for which data processing operation including the error correction operation is completed in the second memory portion.

21 Claims, 6 Drawing Sheets

PRIOR ART

APPARATUS AND METHOD FOR PROCESSING DATA OF AN OPTICAL DISK

BACKGROUND OF THE INVENTION

1. Field of the Invention

The present invention relates to an apparatus and method for processing data of an optical disk. More particularly, the present invention relates to an apparatus and method for processing data of an optical disk which can reduce the memory size needed for a high density optical disk.

2. Description of the Related Art

Recently, new high density optical disks capable of storing high quality video and audio data, e.g., Blu-ray discs (BD), have been widely developed. As the density of the optical disk increases, memory size needed to decode data and to perform data processing, e.g., error correction, also increases. The increased memory size leads to an increase in manufacturing costs.

FIG. 1 illustrates a block diagram of a typical data encoding of a Blu-ray disc. Referring to FIG. 1, in user data recorded in the Blu-ray disc, 64 KB data may form a single ECC (error correction code) cluster. The user data may include 32 frames, each having 2048 bytes. The user data may be encoded through a multilevel signal processing operation, which may include a data frame, a scrambled data frame, a data block, a long distance code (LDC) block, and a LDC cluster. In the LDC block, data may be interleaved twice while passing to the LDC cluster. Meanwhile, user control data, i.e., relevant information corresponding to the user data, may be encoded through another multilevel signal processing operation, which may include an access block, a burst indicator subcode (BIS) block, and BIS cluster.

The BIS cluster, encoded by multilevel signal processing the user control data, may form an ECC cluster by interfering with some data of the LDC cluster, encoded by multilevel signal processing the user data. As shown in FIG. 1, the interference may result in dividing the LDC cluster into four blocks, and the ECC cluster may include 155-byte columns and 496-byte rows.

The ECC cluster may be modularized into physical clusters for disk recording. In the physical cluster, for example, 20-bit frame sync, 25-bit data, and 1-bit dc control may be arranged at a leading portion, and 45-bit data and 1-bit dc control may be alternately arranged.

FIG. 2 illustrates a data structure of the LDC cluster of FIG. 1. As shown in FIG. 1, the data of the LDC cluster may include 152 bytes×496 rows. The LDC data may be arranged in 432 of the 496 rows, while parity may be arranged in the other 64 rows. When interleave is performed twice, data of two adjacent LDC blocks may be alternately arranged in a single column of the LDC cluster. Also, the data and parity may be shifted by three columns to the left for each of two rows.

In the processing of the above encoded data, as the amount of the data stored in the high density optical disk such increases, the capacity of a memory needed to process the data increases accordingly. Also, in storing the data in the memory, the required memory size needs to be reduced through efficient memory management.

However, in the conventional technology, it is a problem that the capacity of a memory needed for data processing, for example, reading out data from a disk, performing error correction, descrambling, and EDC (error detection code) processing, increases. For example, the data read out from the disk may all be stored in an inner memory formed of a static random access memory (SRAM) and error correction may be performed with respect to the stored data. The final data decoded according to the above process may be stored in a synchronous dynamic random access memory (SDRAM). Accordingly, the capacity of a memory needed by a high capacity optical disk reproducing apparatus increases. In particular, since the SRAM is expensive compared to the SDRAM, the increase in the capacity of the SRAM keeps the price of the optical disk reproducing apparatus high.

SUMMARY OF THE INVENTION

The present invention is therefore directed to an apparatus and method for processing data of an optical disk, which substantially overcome one or more of the problems due to the limitations and disadvantages of the related art.

It is therefore a feature of an embodiment of the present invention to provide an apparatus and method for processing data of an optical disk that can reduce the capacity of a memory in a high density optical disk through optimal memory management.

It is therefore a feature of an embodiment of the present invention to provide an apparatus and method for processing data of an optical disk that increases a multiplication speed of a disk.

At least one of the above and other features and advantages of the present invention may be realized by providing a method for decoding data stored in a disk, the method including demodulating a physical cluster read out from the disk and outputting LDC (long distance code) data and BIS (burst indicator subcode) data included in the physical cluster, temporarily storing part of the LDC data and BIS data of the data included in the physical cluster in a first memory portion, reading out the LDC data and BIS data stored in the first memory portion and storing the read out data in a second memory portion, reading out LDC data and BIS data requiring error correction from the second memory portion and temporarily storing the read out data in the first memory portion, and storing LDC data and BIS data for which data processing operation including the error correction operation is completed in the second memory portion.

The reading out of the LDC data and BIS data stored in the first memory portion and storing the read out data in a second memory portion, reading out the LDC data and BIS data stored in the first memory portion and storing the read out data in the second memory portion may be repeated, and all LDC data and BIS data stored in the disk may be stored in the second memory portion. The LDC data stored in the first memory portion may be stored after being shifted in a direction along a row of the first memory portion.

The reading out of the LDC data and BIS data stored in the first memory portion and storing the read out data in a second memory portion, in reading out the LDC data stored in the first memory portion, the LDC data may be read out in a direction along a column of the first memory portion. In reading out the LDC data in the column direction, after data stored in an odd-numbered row of the column is read out, data stored in an even-numbered row of the column may be read out. The LDC data output from the first memory portion may be sequentially stored in a direction along a row of the second memory portion.

In the reading out of LDC data and BIS data requiring error correction from the second memory portion and temporarily storing the read out data in the first memory portion, in reading out the LDC data requiring the error correction, the LDC data may be read out in units of banks of the second memory portion.

The storing of the LDC data and BIS data for which data processing operation including the error correction operation is completed in the second memory portion, the data for which decoding process is completed and stored in the first memory portion may be sequentially read out according to the order of blocks of the LDC data, and the read data may be stored in the second memory portion.

At least one of the above and other features and advantages of the present invention may be realized by providing a method for processing data of an optical disk by encoding data and storing the encoded data in the optical disk, the method including performing EDC (error detection and correction) coding and scrambling user data stored in a first memory portion, outputting LDC data generated through data processing of the EDC coding and scrambling and BIS data generated from predetermined user control data, to a second memory portion, reading out part of the LDC data and BIS data which are stored in the second memory portion and storing the read data in the first memory portion, and generating a physical cluster by modularizing the LDC data and BIS data stored in the first memory portion after the data processing and storing the physical cluster on the optical disk.

At least one of the above and other features and advantages of the present invention may be realized by providing an apparatus for processing data of an optical disk, the apparatus including a modulator/demodulator for demodulating a physical cluster read out from the optical disk and outputting LDC data and BIS data included in the physical cluster, a first memory portion for temporarily storing part of the LDC data and BIS data that are output from the modulator/demodulator, and a second memory portion for receiving the LDC data and BIS data from the first memory portion and storing the received data, and outputting LDC data and BIS data requiring error correction of the stored data, to the first memory portion, wherein the first memory portion includes a first memory region for storing part of the LDC data and BIS data that is output from the modulator/demodulator and outputting the stored data to the second memory portion, and a second memory region for receiving the LDC data and BIS data requiring error correction from the second memory portion and storing the received data, and outputting data for which decoding processing is completed to the second memory portion.

The apparatus may include a memory control portion for controlling data reading and writing with respect to the first and second memory portions, the first memory portion being controlled to repeat storing part of the LDC data and BIS data in the first memory region and outputting the stored data to the second memory portion, and to store all LDC data and BIS data stored on the disk in the second memory portion. The LDC data stored in the first memory region may be stored after being shifted in a direction along a row of the first memory region.

In outputting the LDC data stored in the first memory region, the LDC data may be read out in a direction along a column of the first memory region. In reading out the LDC data in the column direction, after data stored in an odd-numbered row of the column is read out, data stored in an even-numbered row of the column may be read out. The LDC data output from the first memory region may be sequentially stored in a direction along a row of the second memory portion.

In reading out the LDC data requiring the error correction from the second memory portion and outputting the read data to the second memory region, the LDC data may be read out in units of banks of the second memory portion. The data for which decoding process is completed and stored in the second memory region may be sequentially read out according to the order of blocks of the LDC data and the read data may be stored in the second memory portion.

The first memory portion may have a first speed and the second memory portion has a second speed, the first speed being faster than the second speed, and the second memory portion may include first and second banks of memory.

At least one of the above and other features and advantages of the present invention may be realized by providing an article of manufacture having a machine-accessible medium including data that, when accessed by a machine, cause the machine to process data stored in a disk, the processing including demodulating a physical cluster read out from the disk and outputting LDC (long distance code) data and BIS (burst indicator subcode) data included in the physical cluster, temporarily storing part of the LDC data and BIS data of the data included in the physical cluster in a first memory portion, reading out the LDC data and BIS data stored in the first memory portion and storing the read out data in a second memory portion, reading out LDC data and BIS data requiring error correction from the second memory portion and temporarily storing the read out data in the first memory portion, and storing the LDC data and BIS data for which data processing operation including the error correction operation is completed in the second memory portion.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
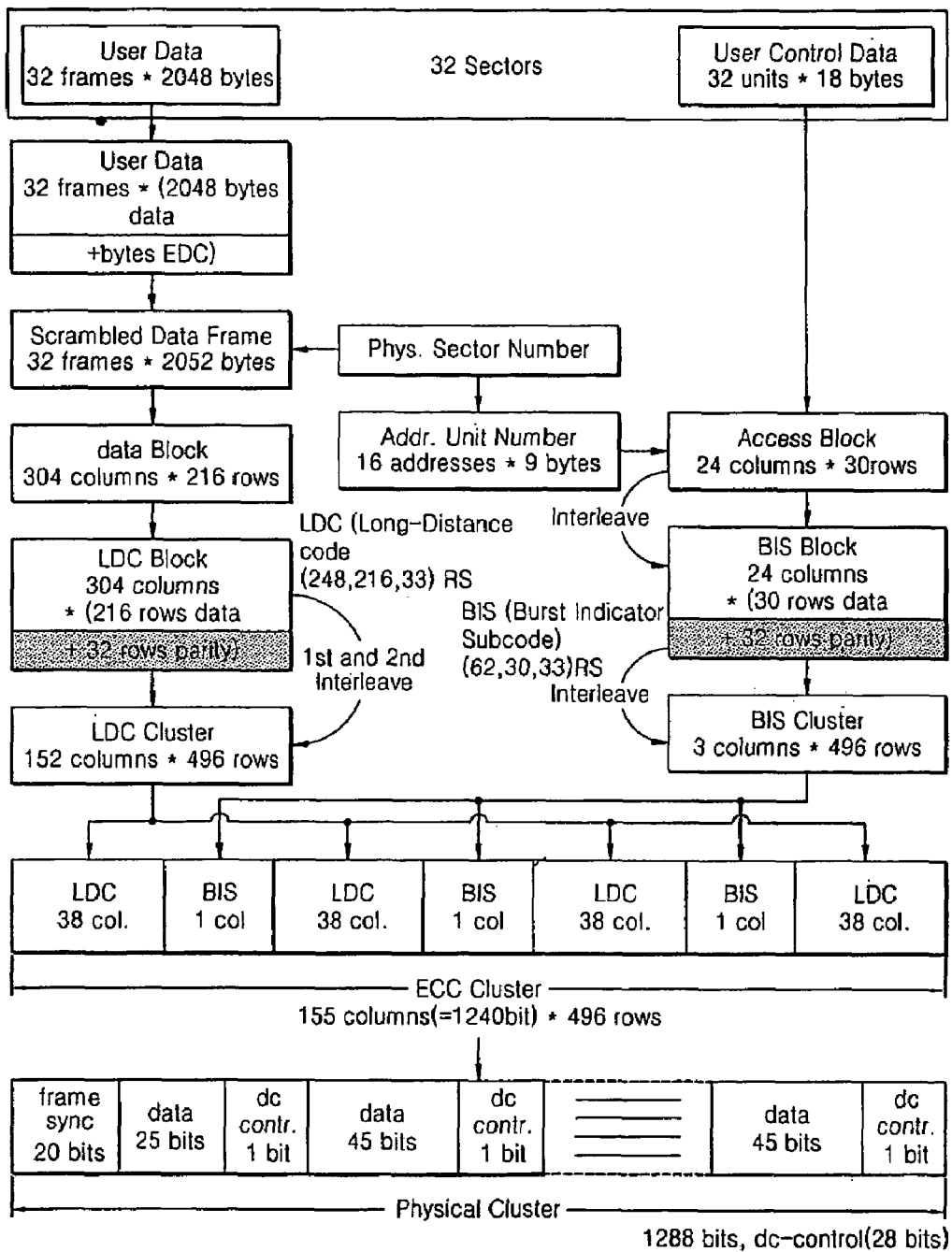
FIG. 1 illustrates a block diagram of a typical data encoding process in a Blu-ray disc.

Korean Patent Application No. 10-2005-0087017, filed on Sep. 16, 2005, in the Korean Intellectual Property Office, and entitled, "Apparatus and Method for Processing Data of Optical Disk," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 3:
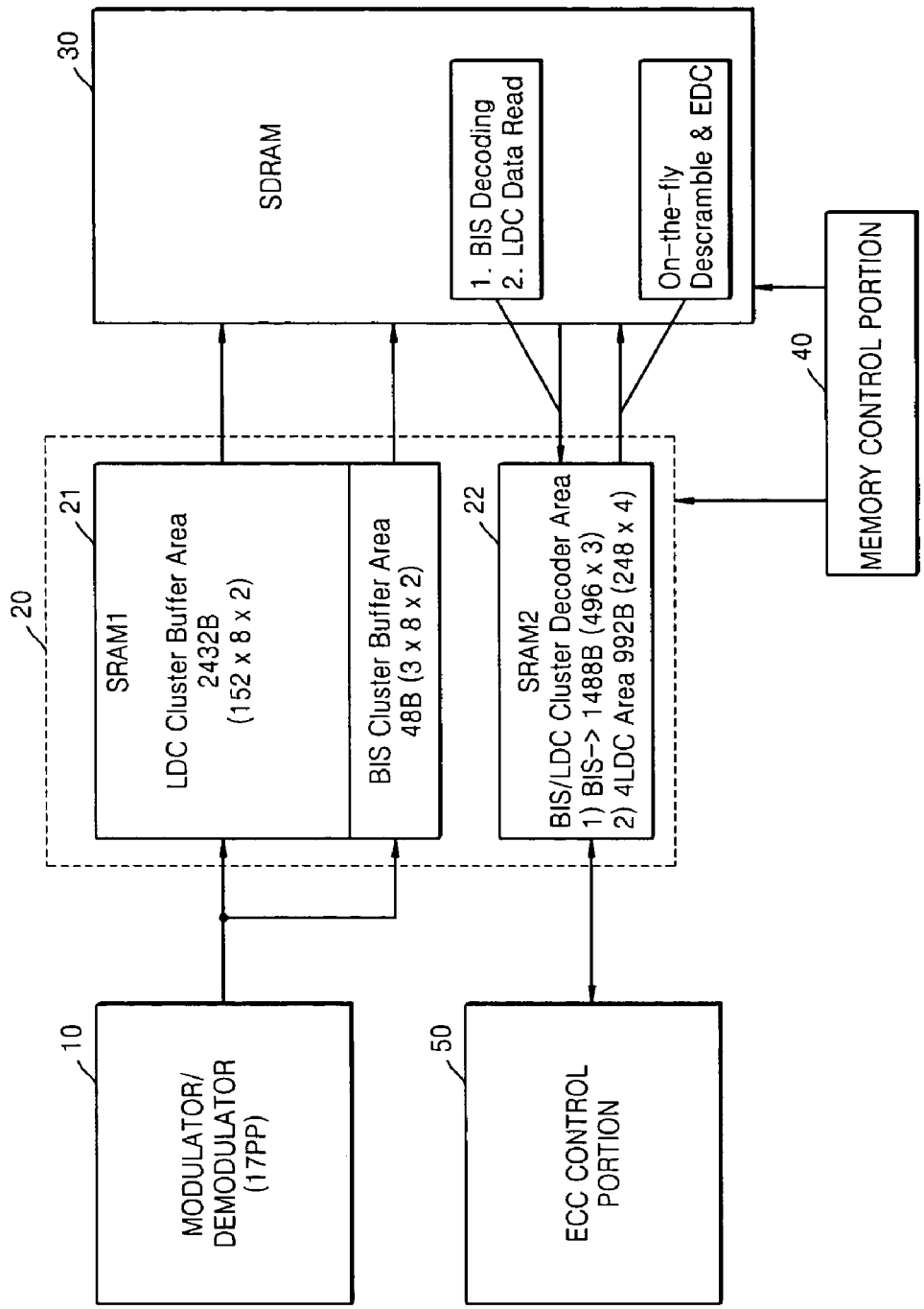
FIG. 3 illustrates a block diagram of a data processing apparatus for an optical disk according to an embodiment of the present invention.

FIG. 3 illustrates a block diagram of a data processing apparatus of an optical disk according to an embodiment of the present invention. Referring to FIG. 3, the data processing apparatus of an optical disk may include a modulator/demodulator 10, a first memory portion 20, a second memory portion 30, and a memory control portion 40 for controlling the first and second memory portions 20 and 30. The first memory portion 20 may be composed of SRAM(s) and the second memory portion 30 may be composed of SDRAM(s). The data processing apparatus of an optical disk may include an ECC control portion 50 for performing error correction by accessing data stored in the first memory portion 20.

The memory control portion 40 may include programmed information on the data transmission and storage between the modulator/demodulator 10 and the first memory portion 20, and the data transmission and storage between the first memory portion 20 and the second memory portion 30, to control the first and second memory portions 20 and 30 according to the characteristics.

A 17 parity preserve-prohibit (17PP) modulator/demodulator may be used as the modulator/demodulator 10. The modulator/demodulator 10 may remove frame sync and dc control bits from a physical cluster stored in the disk, and may transmit the LDC data and the BIS data constituting an ECC cluster, as shown in FIG. 1, to the first memory portion 20.

The first memory portion 20 may include a first memory region 21 and a second memory region 22. The first memory region 21 may temporarily store data transmitted from the modulator/demodulator 10, and may transmit the stored data to the second memory portion 30. Also, the second memory region 22 may temporarily store the data received from the second memory portion 30 for error correction. Although in FIG. 3 the first and second memory regions 21 and 22 are formed of separate SRAMs, the present invention is not limited thereto. For example, the first and second memory regions 21 and 22 may be formed of a single SRAM.

The first memory region 21 of the first memory portion 20 may be divided into a region for storing the LDC data and a region for storing the BIS data which are transmitted from the modulator/demodulator 10. In FIG. 3, for example, the region for storing the LDC data is 152 bytes×8 rows×2 rows and the region for storing the BIS data is 3 bytes×8 rows×2 rows. The SRAM having the above capacity can greatly reduce the capacity compared to the conventional case of six SRAMs, each having a capacity of 37 KB.

Upon receipt from the modulator/demodulator, the LDC data may be stored in the region for storing the LDC data of the first memory region 21 of the first memory portion 20 and the BIS data may be stored in the region for storing the BIS data. When the LDC data is stored in the first memory region 21, the second interleave performed in the data encoding process is taken into account. Referring to the LDC data shown in FIG. 2, since data in the first two rows is not shifted during the second interleave, when the LDC data is stored in the first memory region 21, the LDC data is stored in the first two rows without being shifted.

Figure 2:
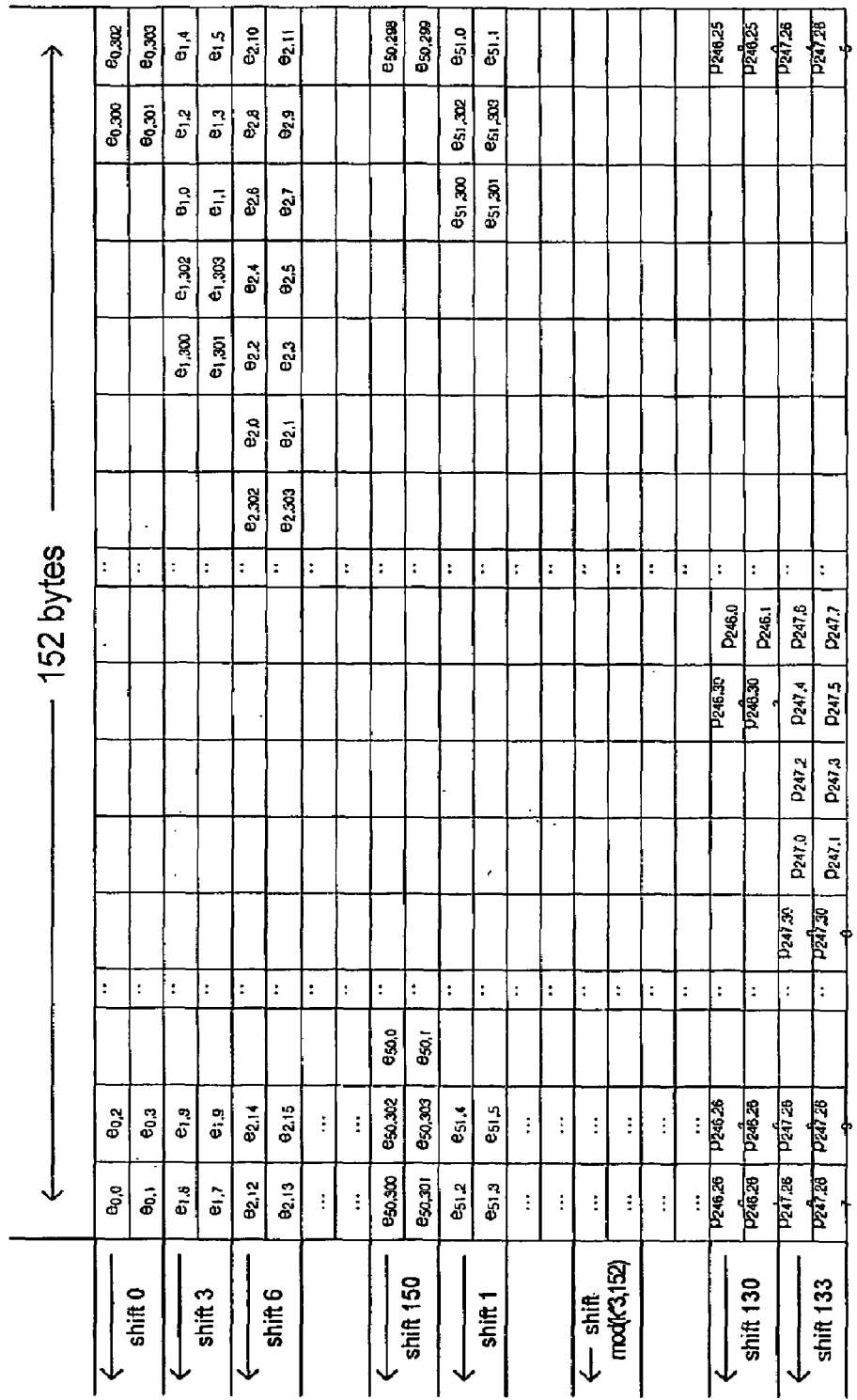
FIG. 2 illustrates a view of a data structure of a LDC cluster of FIG. 1.

During the second interleave, the data stored in the next two rows is shifted to the left by three columns. Thus, when the LDC data is stored in the first memory region 21, the data is stored in the next two rows by being shifted by three columns to the right. In the same manner, the data is stored in another next two rows by being shifted by six columns to the right. This operation can be performed by on-the-fly decoding the LDC block that is second interleaved as shown in FIG. 2.

Figure 4:
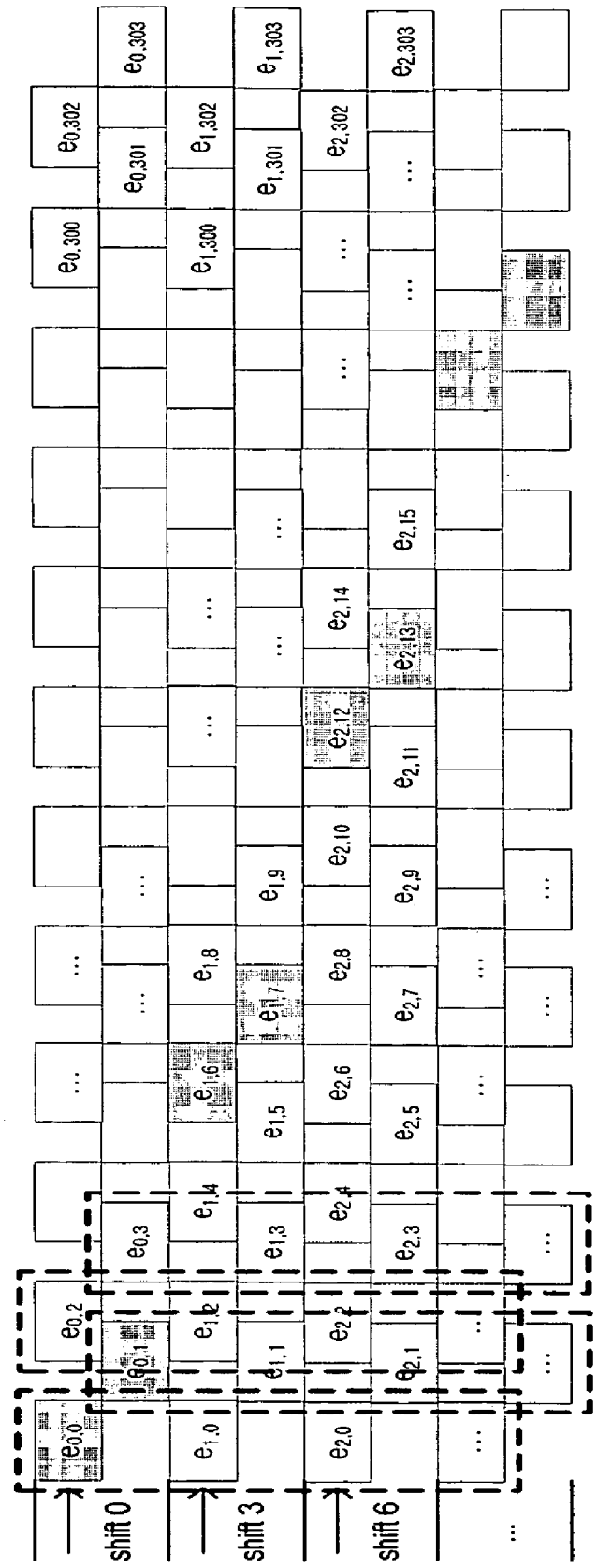
FIG. 4 illustrates a view of the LDC data stored in a first memory portion of FIG. 3.

According to the above-described operation, the LDC data transmitted from the modulator/demodulator 10 may be stored in the first memory region 21 considering the shift. FIG. 4 illustrates an example of a method of storing the LDC data stored in the first memory region 21, and will be described later.

Meanwhile, the LDC data corresponding to a capacity of 152 bytes×8 rows may be stored in the region for storing the LDC data of the first memory region 21. The LDC data stored in the first memory region 21 may be transmitted to the second memory portion 30. Simultaneously, the LDC data transmitted from the modulator/demodulator 10 may be continuously stored in the other region of 152 bytes×8 rows of the first memory region 21.

The BIS data corresponding to a capacity of 3 bytes×8 rows may be stored in the region for storing the BIS data of the first memory region 21. The BIS data stored in the first memory region 21 may be transmitted to the second memory portion 30. Simultaneously, the BIS data transmitted from the modulator/demodulator 10 may be continuously stored in the other region of 3 bytes×8 rows of the first memory region 21.

As shown in FIG. 4, when the LDC data and BIS data of 8 rows are stored in the first memory region 21, the stored data is output to the second memory portion 30. As described above in relation to FIG. 1, when the LDC data of 304 columns×248 rows is converted to the LDC data of 152 columns×496 rows during the data encoding process, the interleave process is performed twice. During the first interleave process, the data of the LDC blocks of the even-numbered columns and the data of the LDC blocks of the odd-numbered columns adjacent to the even-numbered columns may be alternately arranged to form a single column of an LDC cluster. Thus, in storing the LDC data in the second memory portion 30, de-interleave should mirror the first interleave.

A method of outputting the LDC data from the first memory region 21 to the second memory portion 30 is described below.

Figure 5:
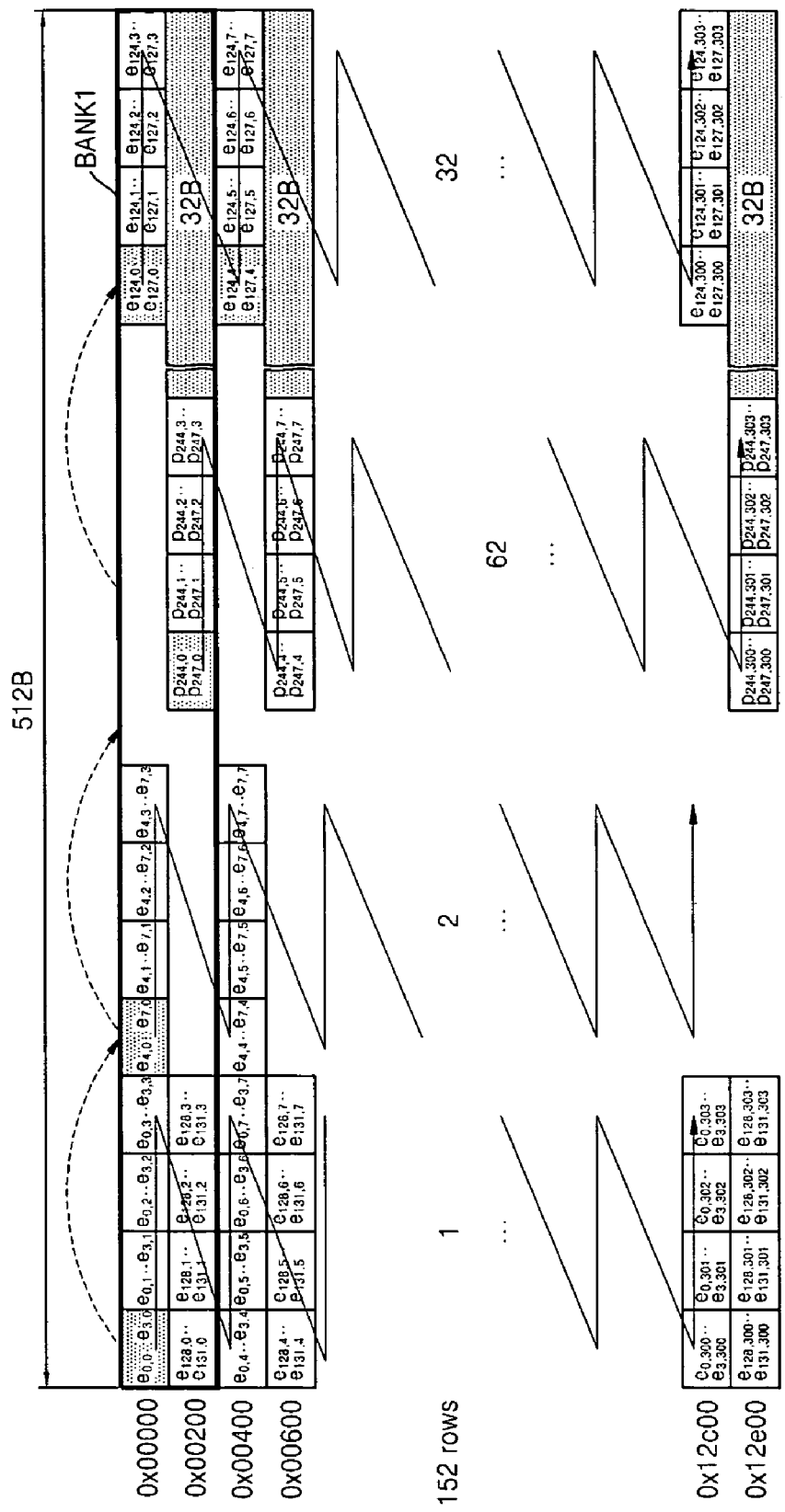
FIG. 5 illustrates a view of the LDC data stored in a second memory portion of FIG. 3.

LDC data "$e_{0,0}$", "$e_{1,0}$", "$e_{2,0}$", and "$e_{3,0}$" stored in the odd-numbered rows of the first column may be read out from the eight rows of LDC data stored in the first memory region 21, and may be stored in the second memory portion 30. Then, LDC data "$e_{0,1}$", "$e_{1,2}$", "$e_{2,1}$", and "$e_{3,1}$" stored in the even-numbered rows of the first column may be read out from the first memory region 21, as shown in FIG. 4, and may be stored in the second memory portion 30, as shown in FIG. 5. In the above-described manner, all the LDC data blocks stored in the 152 columns of the first memory region 21 may be sequentially read out and stored in the second memory portion 30.

FIG. 5 illustrates the LDC data stored in the second memory portion 30 of FIG. 3. Referring to FIG. 5, the LDC data "$e_{0,0}$", "$e_{1,0}$", "$e_{2,0}$", and "$e_{3,0}$" read out in a direction along a column of the first memory region 21 may be stored in a direction along the first row of a first bank of the second memory portion 30. The data "$e_{0,1}$", "$e_{1,2}$", "$e_{2,1}$", and "$e_{3,1}$" sequentially read out from the first memory region 21 may be continuously stored in the first row direction of the second memory portion 30.

In the same manner, after the LDC data is stored in the first bank of the second memory portion 30, the subsequent LDC data "$e_{0,4}$", "$e_{1,4}$", "$e_{2,4}$", and "$e_{3,4}$" may be stored in a next bank of the second memory portion 30 using bank interrupt. In a second bank, the LDC data may be continuously stored in the first row direction in the above-described same manner as that used for the first bank.

As shown in FIG. 5, the LDC data stored in the first memory portion 20 may be stored in the second memory portion 30 in a direction indicated by arrows. When data "$e_{0,303}$", "$e_{1,303}$", "$e_{2,303}$", and "$e_{3,303}$" are stored in the first row direction of a last bank, the subsequent data "$e_{4,0}$", "$e_{5,0}$", "$e_{6,0}$", and "$e_{7,0}$" may be stored in the first bank using the bank interrupt. When a data recording job in the direction of a unit arrow shown in FIG. 5 is repeated 62 times, the LDC data of 152 bytes×496 rows may all be stored in the second memory portion 30.

FIG. 5 illustrates, as an example, that the data is stored using the bank interrupt whenever the 16 bytes LDC data is stored. Also, since the size of the LDC data of an ECC cluster is 152 columns×496 rows, data is not stored at the last 32 bytes of the second row of each bank.

In particular, when the data is stored in the second memory portion 30, the data may be stored using the bank interrupt as described above so that the row address strobe (RAS) delay time needed by the SDRAM may be reduced. Accordingly, the time for recording data in the memory portion may be reduced, so that an optical disk reproduction apparatus supporting a higher multiplication speed may be provided.

After the data is stored in the second memory portion 30, the LDC data and BIS data may be read out from the second memory portion 30 to perform data error correction. As shown in FIG. 3, the LDC data and BIS data for the data error correction may be stored in the second memory region 22. As an example, 992 bytes LDC data and 1488 bytes BIS data may be stored in the second memory region 22. In particular, the BIS data of 3 columns×496 rows may all be stored in the second memory region 22. This is because the amount of the BIS data is small and the interleave process is complicated, the BIS data may all be stored in the second memory region 22 and processed in a read only memory (ROM) address manner.

The ECC control portion 50 may perform error correction with respect to the LDC data stored in the second memory region 22 of the first memory portion 20. The data to which the error correction is performed may undergo descrambling and EDC operation. When the decoding is completed, the decoded data may be stored again in the second memory portion 30.

Meanwhile, as described above, for the data error correction, the LDC data and BIS data are read out from the second memory portion 30 and stored in the second memory region 22. In particular, in FIG. 5, 992 bytes data "$e_{0,0}$", . . . , "$e_{3,0}$" through "$p_{244,3}$", . . . , "$p_{247,3}$" recorded in Bank1 may be read out from the data stored in the second memory portion 30 and stored in the second memory region 22. The reading out may be performed in a burst manner. When the data is read out from the second memory portion 30 in the burst manner, since the bandwidths of the first and second memory portions 20 and 30 may be matched, the speed may be improved.

The data stored in the second memory region 22 may undergo the error correction, descrambling, and EDC, so that the finally decoded data may be stored again in the second memory portion 30. When the decoded data is stored in the second memory portion 30, the decoded data stored in the first memory portion 20 may be sequentially read out according to the order of blocks of the LDC data, and the read data may be stored in the second memory portion 30.

As described above, the data "$e_{0,0}$", . . . , "$e_{3,0}$" through "$p_{244,3}$", . . . , "$p_{247,3}$" may be stored in the second memory region 22 in units of BANK1 of the second memory portion 30 and may undergo data processing. Then, the finally decoded data stored in the second memory region 22 may be sequentially read out according to the order of blocks of the LCD data. For example, as indicated by a dotted line of FIG. 5, the decoded data "$e_{0,0}$", . . . , "$e_{3,0}$", "$e_{4,0}$", . . . , "$e_{7,0}$" . . . may be read out from the first LDC block and stored in the second memory portion 30. Accordingly, when the data decoded from the first LDC block is completed, the data "$e_{0,1}$", . . . , "$e_{3,1}$", "$e_{4,1}$", . . . , "$e_{7,1}$" . . . decoded from the second LDC block may be read out from the second memory region 22 and stored in the second memory portion 30. According to the above method, the finally decoded data stored in the second memory portion 30 may be sequentially stored according to the order of blocks of the LDC data.

Figure 6:
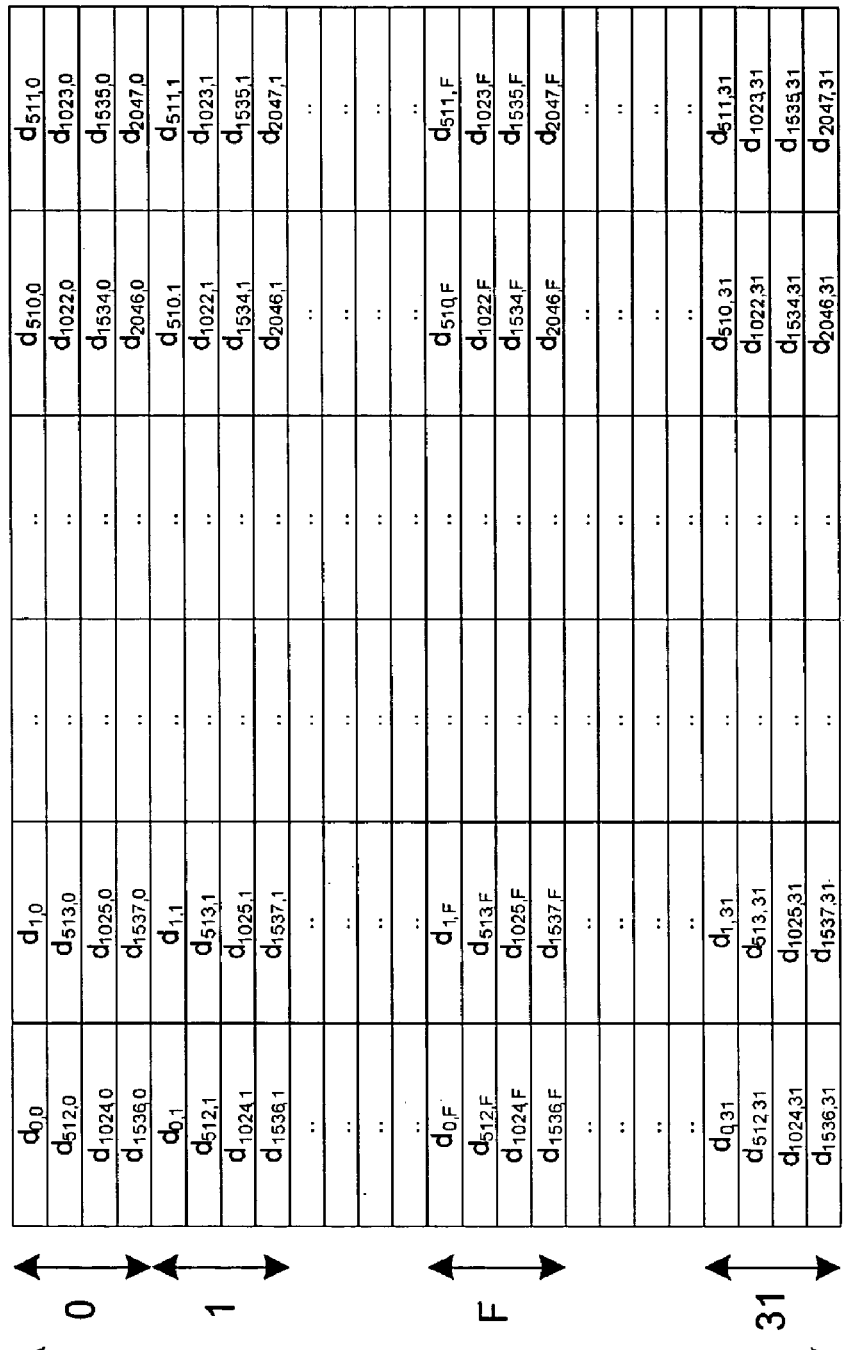
FIG. 6 illustrates a map of a memory for storing decoded data according to an embodiment of the present invention.

FIG. 6 illustrates a map of a memory for storing decoded data $d_{0,0}$ to $d_{2047,31}$ according to an embodiment of the present invention. The finally decoded data may be stored in 512 bytes columns×32 frames (128 rows) of the second memory portion 30 as shown in FIG. 6. Referring to the memory map of FIG. 6, the finally decoded data may be stored in order of blocks of the LDC data. When a host requests data reading, the data stored in the second memory portion 30 may be read out in a horizontal direction and transmitted to the host.

An exemplary process of decoding the data read out from a disk and storing the same in the memory portion according to the embodiment of the present invention is described above. The data encoding process may be performed in the reverse order of the data decoding process. Accordingly, the above embodiment can be applied to the data encoding process which is performed in the reverse order of the data decoding process.

As described above, according to the present invention, since the data processing method effectively manages the required memory, the memory size of an SRAM needed in a data processing apparatus for a high density optical disk, e.g., a Blu-ray disc, may be reduced, and the multiplication speed of the data processing apparatus may be increased.

Exemplary embodiments of the present invention have been disclosed herein, and although specific terms are employed, they are used and are to be interpreted in a generic and descriptive sense only and not for purpose of limitation. For example, the processing of data stored in an optical disk of the present invention may be implemented in software, e.g., by an article of manufacture having a machine-accessible medium including data that, when accessed by a machine, cause the machine to process the data in accordance with methods of the present invention. Accordingly, it will be understood by those of ordinary skill in the art that various changes in form and details may be made without departing from the spirit and scope of the present invention as set forth in the following claims.

What is claimed is:

1. A method for decoding data stored in a disk, the method comprising:
   demodulating a physical cluster read out from the disk and outputting LDC (long distance code) data and BIS (burst indicator subcode) data included in the physical cluster;
   temporarily storing part of the LDC data and BIS data of the data included in the physical cluster in a first memory portion;
   reading out the LDC data and BIS data stored in the first memory portion and storing the read out data in a second memory portion;
   reading out LDC data and BIS data requiring error correction from the second memory portion and temporarily storing the read out data in the first memory portion; and
   storing LDC data and BIS data, for which data processing operations including the error correction operation are completed, in the second memory portion.

2. The method as claimed in claim 1, wherein, in the reading out of the LDC data and BIS data stored in the first memory portion and storing the read out data in a second memory portion, reading out the LDC data and BIS data stored in the first memory portion and storing the read out data in the second memory portion is repeated, and all LDC data and BIS data stored in the disk are stored in the second memory portion.

3. The method as claimed in claim 2, wherein the LDC data stored in the first memory portion is stored after being shifted in a direction along a row of the first memory portion.

4. The method as claimed in claim 1, wherein, in the reading out of the LDC data and BIS data stored in the first memory portion and storing the read out data in a second memory portion, in reading out the LDC data stored in the first memory portion, the LDC data is read out in a direction along a column of the first memory portion.

5. The method as claimed in claim 4, wherein, in reading out the LDC data in the column direction, after data stored in an odd-numbered row of the column is read out, data stored in an even-numbered row of the column is read out.

6. The method as claimed in claim 5, wherein the LDC data output from the first memory portion is sequentially stored in a direction along a row of the second memory portion.

7. The method as claimed in claim 1, wherein, in the reading out of LDC data and BIS data requiring error correction from the second memory portion and temporarily storing the read out data in the first memory portion, in reading out the LDC data requiring the error correction, the LDC data is read out in units of banks of the second memory portion.

8. The method as claimed in claim 1, wherein, in the storing of the LDC data and BIS data for which data processing operation including the error correction operation is completed in the second memory portion, the data for which decoding process is completed and stored in the first memory portion is sequentially read out according to the order of blocks of the LDC data, and the read data is stored in the second memory portion.

9. The method as claimed in claim 1, wherein the optical disk is a Blu-ray disc.

10. A method for processing data of an optical disk by encoding data and storing the encoded data in the optical disk, the method comprising:
performing EDC (error detection and correction) coding and scrambling user data stored in a first memory portion;
outputting LDC data generated through data processing of the EDC coding and scrambling and BIS data generated from predetermined user control data, to a second memory portion;
reading out part of the LDC data and BIS data which are stored in the second memory portion and storing the read data in the first memory portion; and
generating a physical cluster by modularizing the LDC data and BIS data stored in the first memory portion after the data processing and storing the physical cluster on the optical disk.

11. An apparatus for processing data of an optical disk, the apparatus comprising:
a modulator/demodulator for demodulating a physical cluster read out from the optical disk and outputting LDC data and BIS data included in the physical cluster;
a first memory portion for temporarily storing part of the LDC data and BIS data that are output from the modulator/demodulator; and
a second memory portion for receiving the LDC data and BIS data from the first memory portion and storing the received data, and outputting LDC data and BIS data requiring error correction of the stored data, to the first memory portion;
wherein the first memory portion includes:
a first memory region for storing part of the LDC data and BIS data that is output from the modulator/demodulator and outputting the stored data to the second memory portion; and
a second memory region for receiving the LDC data and BIS data requiring error correction from the second memory portion and storing the received data, and outputting data for which decoding processing is completed to the second memory portion.

12. The apparatus as claimed in claim 11, further comprising a memory control portion for controlling data reading and writing with respect to the first and second memory portions, the first memory portion being controlled to repeat storing part of the LDC data and BIS data in the first memory region and outputting the stored data to the second memory portion, and to store all LDC data and BIS data stored on the disk in the second memory portion.

13. The apparatus as claimed in claim 12, wherein the LDC data stored in the first memory region is stored after being shifted in a direction along a row of the first memory region.

14. The apparatus as claimed in claim 11, wherein, in outputting the LDC data stored in the first memory region, the LDC data is read out in a direction along a column of the first memory region.

15. The apparatus as claimed in claim 14, wherein, in reading out the LDC data in the column direction, after data stored in an odd-numbered row of the column is read out, data stored in an even-numbered row of the column is read out.

16. The apparatus as claimed in claim 15, wherein the LDC data output from the first memory region is sequentially stored in a direction along a row of the second memory portion.

17. The apparatus as claimed in claim 11, wherein, in reading out the LDC data requiring the error correction from the second memory portion and outputting the read data to the second memory region, the LDC data is read out in units of banks of the second memory portion.

18. The apparatus as claimed in claim 11, wherein the data for which decoding process is completed and stored in the second memory region is sequentially read out according to the order of blocks of the LDC data and the read data is stored in the second memory portion.

19. The apparatus as claimed in claim 11, wherein the optical disk is a Blu-ray disc.

20. The apparatus as claimed in claim 11, wherein the first memory portion has a first speed and the second memory portion has a second speed, the first speed being faster than the second speed, and
the second memory portion includes first and second banks of memory.

21. An article of manufacture having a machine-accessible medium including data that, when accessed by a machine, cause the machine to process data stored in a disk, the processing comprising:
demodulating a physical cluster read out from the disk and outputting LDC (long distance code) data and BIS (burst indicator subcode) data included in the physical cluster;
temporarily storing part of the LDC data and BIS data of the data included in the physical cluster in a first memory portion;
reading out the LDC data and BIS data stored in the first memory portion and storing the read out data in a second memory portion;
reading out LDC data and BIS data requiring error correction from the second memory portion and temporarily storing the read out data in the first memory portion; and
storing the LDC data and BIS data for which data processing operation including the error correction operation are completed, in the second memory portion.

* * * * *